United States Patent
Hashimoto et al.

(10) Patent No.: US 6,592,726 B1
(45) Date of Patent: Jul. 15, 2003

(54) VACUUM ARC EVAPORATION METHOD, VACUUM ARC EVAPORATION SYSTEM, AND ROTARY CUTTING TOOL

(75) Inventors: Yasuhisa Hashimoto, Itami (JP); Kazuo Yamagata, Itami (JP); Akihiko Ikegaya, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/701,020

(22) PCT Filed: Mar. 16, 2000

(86) PCT No.: PCT/JP00/01618

§ 371 (c)(1), (2), (4) Date: Nov. 22, 2000

(87) PCT Pub. No.: WO00/56947

PCT Pub. Date: Sep. 28, 2000

(30) Foreign Application Priority Data

Mar. 23, 1999 (JP) .............................. 11/77928

(51) Int. Cl.⁷ .............................. C23C 14/32
(52) U.S. Cl. .............................. 204/192.38; 204/298.41
(58) Field of Search .................. 204/192.38, 298.41

(56) References Cited

U.S. PATENT DOCUMENTS 4,929,322 A * 5/1990 Sue et al. .............. 204/192.38
6,103,074 A * 8/2000 Khominich ............ 204/192.38

FOREIGN PATENT DOCUMENTS

| JP | 5-171426 | 7/1993 |
|---|---|---|
| JP | 9-170073 | 6/1997 |
| JP | 10-68071 | 3/1998 |
| JP | 10-251845 | 9/1998 |
| JP | 11-61391 | 3/1999 |

OTHER PUBLICATIONS

J. Kourtev et al., "Arc evaporated Ti–N films with reduced macroparticle", Contamination Thin Solid Films, 1996, vol. 287, No. 1/2, pp. 202–207.

* cited by examiner

Primary Examiner—Rodney G. McDonald
(74) Attorney, Agent, or Firm—McDermott, Will & Emery

(57) ABSTRACT

A vacuum arc coating process that can form a hard coating layer excellent in both bonding quality with the substrate and surface roughness, a coating machine for this process, and a revolving cutting tool produced by this process. Vacuum chamber 1 is provided with subchamber 3 that is less evacuatable than coating chamber 2. Arcing-type evaporation source 4 is placed in subchamber 3. A gas such as nitrogen gas is introduced into subchamber 3 from gas-introducing portion 6 when substrate 10 is cleaned before the deposition, so that the gas pressure is kept higher in subchamber 3 than in the vicinity of substrate 10. This condition suppresses the generation of molten particles when the cathode (the evaporating material) of arc evaporation source 4 is melted and ionized, without reducing the sputtering effect. A revolving cutting tool thus obtained has a small magnitude of surface roughness.

10 Claims, 2 Drawing Sheets

VACUUM ARC EVAPORATION METHOD, VACUUM ARC EVAPORATION SYSTEM, AND ROTARY CUTTING TOOL

TECHNICAL FIELD

The present invention relates to a vacuum arc coating process for forming a coating layer by deposition on the surface of cutting tools and other objects in order to improve their wear resistance, a vacuum arc coating machine for this process, and a revolving cutting tool excellent in discharging the chips.

BACKGROUND ART

Tools and metal molds required to have high-grade wear resistance have been coated with hard substances such as TiN on their surface to improve the wear resistance. In this case, the coating is carried out by the chemical vapor deposition (CVD) process or the physical vapor deposition (PVD) process. A vacuum arc coating process, a type of PVD process, is superior in the bonding quality between the hard coating layer and the substrate because this process cleans the surface of the substrate by sputtering before the deposition is performed. After the surface cleaning, however, this process produces a coating layer with poor surface roughness, because the surface of the substrate is subjected to deposition of molten particles, known as droplets, readily produced at the same time atoms are transformed to plasma by arc discharges.

In order to solve this drawback, the published Japanese patent application Tokukaihei 10-68071 discloses a process in which nitrogen gas is blown onto the surface of the cathode (the evaporating material) of the evaporating source in order to nitride the surface of the cathode so that the generation of the molten particles is reduced. It reports that the obtained coating layer has a surface roughness of 0.2 $\mu$m.

In the process shown in the above application, the nitrogen gas is blown onto the cathode surface in a coating chamber that is directly evacuated by a vacuum pump. Consequently, the blown nitrogen gas is instantaneously sucked in by the vacuum pump, so as to prevent the cathode surface from being nitrided sufficiently. If the amount of the blown nitrogen gas is increased, the partial pressure of nitrogen in the vicinity of the substrate increases, reducing the sputtering effect. Therefore, the coating layer cannot obtain sufficient bonding strength. As a result, the generation of molten particles cannot be suppressed effectively, and the obtained coating layer cannot have sufficiently reduced surface roughness.

Another published Japanese patent application, Tokukaihei 9-170073, discloses that a coating layer with a small magnitude of surface roughness can be obtained when the substrate surface is cleaned with a gas such as a mixture of a rare gas and nitrogen. However, this process uses low partial pressure of nitrogen in the subchamber, so that the surface of the arc evaporation source cannot be sufficiently nitrided. Consequently, the generation of the molten particles cannot be suppressed sufficiently.

The present invention is intended to solve the above-mentioned problems by improving the vacuum arc coating process and machine in order to form a coating layer excellent in the bonding strength with the substrate and in surface roughness.

DISCLOSURE OF THE INVENTION

The present invention relates to a vacuum arc coating process in which an arc evaporation source and a substrate are placed in a vacuum chamber to produce arc discharges at the surface of the cathode of the arc evaporation source so that the generated ions clean the substrate and subsequently form a coating layer on the substrate. More specifically, the vacuum arc coating process of the present invention provides the vacuum chamber with a subchamber having a gas-introducing portion, connects the subchamber to the coating chamber of the vacuum chamber, and places the arc evaporation source in the subchamber. At the time of substrate cleaning, a reactive gas, an inert gas, or a mixture of both is introduced into the subchamber from the gas-introducing portion so that the gas pressure in the subchamber is kept higher than that in the vicinity of the substrate.

The present invention also relates to a vacuum arc coating machine that provides the vacuum chamber with a subchamber having a gas-introducing portion, connects the subchamber to the coating chamber of the vacuum chamber, and places an arc evaporation source in the subchamber.

The present invention also relates to a revolving cutting tool having a coating layer of TiN, ZrC, or TiO, or a combination of them at least on the surface of its grooves. The coating layer has a thickness of 0.2 to 20 $\mu$m and an average surface roughness, Ra, not more than 0.05 $\mu$m.

The present inventors studied a method to reduce the partial pressure of nitrogen in the vicinity of the substrate while only the surface of the cathode of the arc evaporating source is nitrided. The present inventors anticipated that the foregoing object can be fulfilled by the following process: As shown in FIG. 1, a vacuum chamber 1 is provided with a subchamber 3 that is connected to a coating chamber 2 of the vacuum chamber 1. An arc evaporation source 4 is placed in the subchamber 3. The subchamber 3 is provided with a gas-introducing portion 6 to introduce nitrogen gas. Because the subchamber 3 is less evacuatable than the coating chamber 2, only the partial pressure of the nitrogen in the vicinity of the cathode of the arc evaporation source 4 can be increased.

This arrangement increases the partial pressure of the nitrogen in the subchamber 3 even when a small amount of nitrogen gas is introduced from the gas-introducing portion 6. On the other hand, the coating chamber 2 in which a substrate 10 is placed, is directly connected with a vacuum pump 7 and evacuated at a high rate. Consequently, the partial pressure of the nitrogen in the vicinity of the substrate 10 is kept low. As a result, while the substrate is cleaned by ion bombardment with a noticeable sputtering effect, the generation of molten particles at the cathode of the evaporating source can be suppressed.

The present inventors found that when a subchamber 3 is provided and the pressure of the introduced gas in the vicinity of the evaporating source is kept high, some gases other than nitrogen can have an effect of suppressing the molten particles. For reducing the quantity of molten particles, it is desirable to use at least one type of gas selected from the group consisting of nitrogen, hydrogen, methane, argon, helium, acetylene, and oxygen gases.

When a reactive gas is used, the gas nitrides, oxidizes, or carbonizes the cathode to form compounds with a high melting point on the surface of the cathode, so that the generation of molten particles can be suppressed. The detailed explanation given below uses a nitrided film as an example.

When an inert gas is used, the gas increases the sputtering effect in the cleaning of a substrate. This increase in sputtering effect reduces the cleaning time, thereby reducing the deposited quantity of molten particles.

In the coating process, it is desirable that the gas pressure in the subchamber 3 be controlled to fall within the range of 0.0001 to 10 Pa. If less than 0.0001 Pa, the molten particles cannot be decreased sufficiently. If more than 10 Pa, the partial gas pressure in the vicinity of the substrate is increased excessively, so that the sputtering effect is reduced depending on the type of gas used. Therefore, when the gas pressure fails to fall within the foregoing range, it is difficult to satisfy concurrently the requirements for bonding strength and surface roughness. It is more desirable that the gas pressure be in the range of 0.05 to 1 Pa. The pressure in the subchamber and coating chamber can be measured by a diaphragm gauge.

Figure 1:
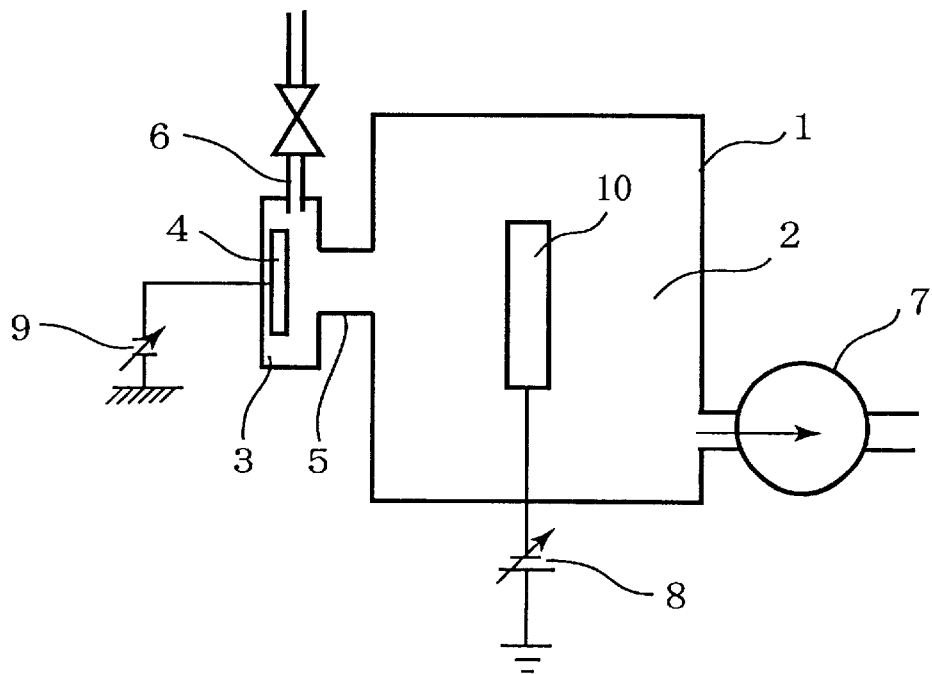
FIG. 1 is a diagram showing the outline of an embodiment of the vacuum arc coating machine of the present invention.

In the drawings, the numeral 1 signifies a vacuum chamber, 2 a coating chamber, 3 a subchamber, 4 an arc evaporation source, 5 a flow resistance portion, 5a a flap, 5b a shutter, 6 and 11 a gas-introducing portion, 7 a vacuum pump, 8 a bias voltage source, 9 an arc power source, 10 a substrate, and 20 a magnetic field-forming coil.

BEST MODE FOR CARRYING OUT THE INVENTION

FIG. 1 shows an embodiment of the present invention. The vacuum arc coating machine of the present invention is provided with a vacuum chamber 1 having a coating chamber 2 to which a subchamber 3 is connected through a flow resistance portion 5. An arc evaporation source 4 is placed in the subchamber 3 having a gas-introducing portion 6. The coating chamber 2 is connected with a vacuum pump 7 thereby allowing direct evacuation. A bias voltage source 8 applies negative bias voltage to a substrate 10 placed in the coating chamber 2. An arc power source 9 is provided for the arc evaporation source 4.

In the coating machine shown in FIG. 1, arc discharges melt and ionize the cathode (the evaporating material) of the arc evaporation source 4. The generated ions are attracted by the substrate 10 applied with negative bias voltage. The ions then react with a reactive gas introduced into the coating chamber 2 to form a hard coating layer.

While nitrogen gas, for example, is introduced from the gas-introducing portion 6, the cathode of the arc evaporation source 4 is ionized by arc discharges. At the same time, negative bias voltage (desirably −300 to −2,000 V) is applied to the substrate 10 so that the substrate can be cleaned by ion bombardment before the deposition.

The coating chamber 2 is evacuated at the time of both the ion bombardment and the deposition. The subchamber 3 is connected with the vacuum pump 7 through the coating chamber 2. Since the subchamber 3 is evacuated through the flow resistance portion 5, the flow resistance in that portion increases the partial pressure of the nitrogen in the subchamber 3, that is, in the vicinity of the cathode of the arc evaporation source 4, and keeps the pressure at a higher value than that in the vicinity of the substrate 10. The cathode of the arc evaporation source 4 is nitrided at a higher rate when the partial pressure of the nitrogen in the vicinity is increased. Therefore, it is not necessary to increase the amount of the introduced nitrogen gas in order to promote the nitriding reaction. Consequently, not only can the sputtering be performed effectively by the ion bombardment but also the molten particles can be reduced in size and decreased in the amount of generation.

After the substrate has been cleaned by the ion bombardment, the pressure in the coating chamber 2 is increased up to about 2.6 Pa by continuing the introduction of the nitrogen gas. During the deposition, the surface of the cathode of the arc evaporation source 4 is also being nitrided. Consequently, the molten particles can be reduced in size and their generation itself can be suppressed. The pressure in the coating chamber is usually maintained at 0.007 to 70 Pa. However, it is desirable to maintain the value at 0.01 to 15 Pa. The bias voltage applied to the substrate at the time of deposition is usually in the range of 0 to −500 V. However, it is desirable to maintain the value at −40 to −250 V. These conditions can further improve the surface roughness of the coating layer without compromising the bonding strength with the substrate.

Figure 2:
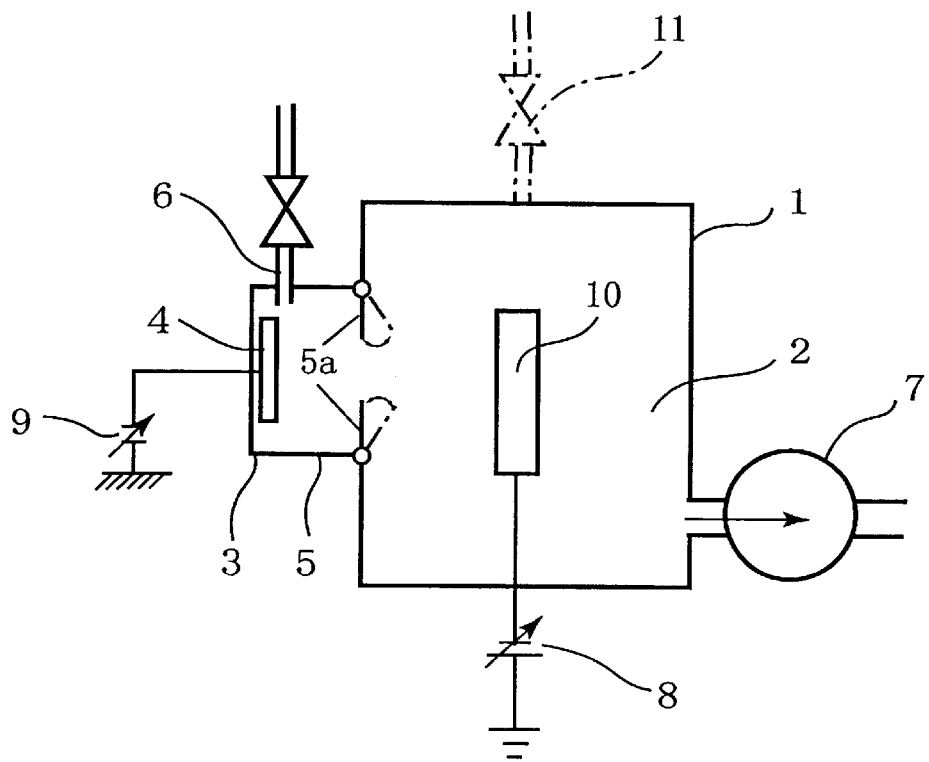
FIG. 2 is a diagram showing the outline of another embodiment.
Figure 3:
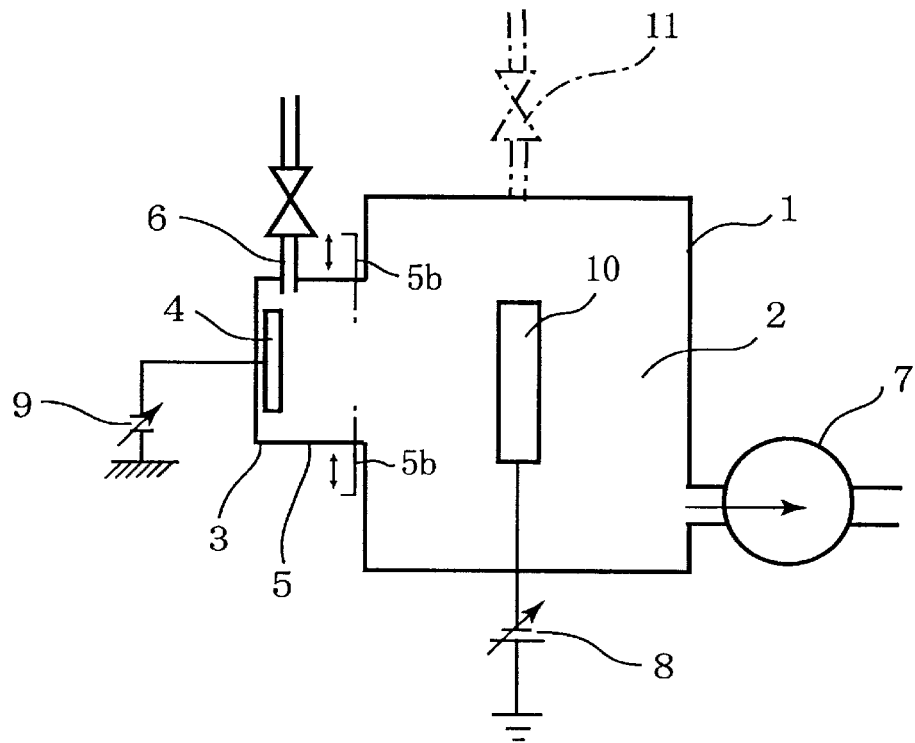
FIG. 3 is a diagram showing the outline of yet another embodiment.

The flow resistance portion 5 of the coating machine shown in FIG. 1 is produced by reducing the cross-sectional area of the passage. Nevertheless, its flow resistance (or its flow conductance) may be made variable provided that the ion flow is not obstructed. FIGS. 2 and 3 show examples of this idea. A flap 5a in FIG. 2 and a shutter 5b in FIG. 3 vary the flow resistance by adjusting the opening of the passage. The coating machine shown in FIG. 4 has a magnetic field-forming coil 20. This coil forms a magnetic field between the subchamber and the coating chamber in order to conduct the ions to the substrate. The magnetic field has no conduction effect on neutral molten particles, so that the generation of the magnetic field can reduce the quantity of the molten particles that reach and deposit onto the substrate 10.

As shown in FIG. 2, another gas-introducing portion 11 may be provided directly to the vacuum chamber 1 to introduce a reactive gas for deposition. The coating machines shown in FIGS. 2 and 3 allow a free setting of the gas pressure ratio between the subchamber 3 and the coating chamber 2.

The effect of the reduced quantity in molten particles and of the improved surface roughness was confirmed by producing revolving cutting tools. The term "revolving cutting tools" is used to mean tools such as a drill and an end mill. These tools are required to produce high precision in the finishing surface and to have good performance in discharging the chips. High-speed cutting of materials that are difficult to machine has been strongly required in recent years. In particular, drills are required to efficiently discharge the chips, generated at the time of drilling, with small resistance. At the time of chip discharge, the chips are in contact with the groove. Consequently, when the groove has a smaller magnitude in surface roughness, the chips are discharged more easily.

The present inventors confirmed the effect of the present invention by forming a coating layer on the surface of the groove of a drill with the coating machine of the present invention. The groove's average surface roughness of no more than 0.05 μm enabled deep-hole drilling at a higher rate than conventional methods, which had been deemed to be impossible.

The coating layer usually has a thickness of 0.2 to 20 μm. However, it is desirable that the coating layer have a thickness of 0.5 to 10 μm. If it is excessively thin, the effect of the coating such as the improvement in wear resistance cannot be expected. If it is excessively thick, the increased production cost cannot be compensated with the corresponding effect.

The present invention is further explained by the embodiments below.

Embodiment 1

A coating layer of TiN was formed on the surface of a substrate made of cemented carbide by using a coating machine having the structure shown in FIG. 1.

The production process was as follows: The substrate was cleaned by ion bombardment before the deposition under the following conditions:

Ion bombardment conditions:
Cathode material: Ti
Arc current: 90 A
Amount of nitrogen gas introduced into subchamber: 50 sccm
Pressure in subchamber: 0.06 Pa
Applied voltage to substrate: −1,000 V
Treatment time: 5 min Subsequently, the deposition was carried out under the following conditions, with nitrogen gas being introduced into the coating chamber through the subchamber:

Deposition conditions:
Amount of nitrogen gas introduced into subchamber: 200 sccm
Pressure in coating chamber: 2.6 Pa
Applied voltage to substrate: −200 V
Layer thickness: 3 μm The TiN layer thus obtained and a TiN layer, 3 μm in thickness, obtained with a coating machine having no subchamber were subjected to the measurements of the average surface roughness and the bonding strength with the substrate. The results are shown in Table 1. The average surface roughness Ra was measured by a tracer-type roughness meter. This roughness is the average surface roughness stipulated by the Japanese Industrial Standard (JIS) B 0601. The bonding strength was measured by an acoustic emission-type scratch tester. In this test, acoustic emission-generating critical weight was measured at three points on each test sample.

TABLE 1

|  | Measured Results | |
| --- | --- | --- |
|  | With subchamber (present invention) | Without subchamber (comparative example) |
| Average surface roughness (Ra) | 0.03 μm | 0.8 μm |
| Bonding strength | 60 N | 50 N |

Embodiment 2

Ion bombardment was carried out by introducing a nitrogen-argon mixed gas with a ratio of 1:1 into the subchamber. With the amount of gas introduction and other conditions remaining the same as in Embodiment 1, the cleaning of the substrate and the subsequent deposition were carried out. The obtained TiN layer has nearly the same average surface roughness and bonding strength as those of the one obtained in Embodiment 1.

Such a similar result is attributed to that although the cathode was less nitrided than in Embodiment 1, the quantity of molten particles deposited on the substrate was decreased due to the following reasons:

(a) The pressure inside the subchamber was kept high; and
(b) The cleaning time was reduced to three minutes because the introduction of argon gas increased the sputtering effect.

Embodiment 3

The cleaning of the substrate by ion bombardment and the subsequent deposition were carried out under the conditions described below. A layer of ZrC, 5 μm in thickness, was formed on the surface of a TiCN—WC—Co—Ni-based cermet substrate. The layer's average surface roughness and bonding strength with the substrate were measured. The results are shown in Table 2.

Ion bombardment conditions:
Cathode material: Zr
Arc current: 100 A
Type of gas introduced into subchamber: methane
Amount of gas introduced into subchamber: 80 sccm
Pressure in subchamber: 0.1 Pa
Applied voltage to substrate: −1,000 V
Treatment time: 5 min
Deposition conditions:
Type of gas introduced into subchamber: methane
Amount of gas introduced into subchamber: 300 sccm
Pressure in coating chamber: 5 Pa
Applied voltage to substrate: −200 V
Treatment time: 20 min

TABLE 2

|  | Measured Results | |
| --- | --- | --- |
|  | With subchamber (present invention) | Without subchamber (comparative example) |
| Average surface roughness | 0.05 μm | 0.3 μm |
| Bonding strength | 50 N | 45 N |

Embodiment 4

The ion bombardment and deposition conditions were changed from the above embodiment. A layer of TiO, 1 μm in thickness, was formed on a cemented carbide substrate. The layer's average surface roughness and bonding strength with the substrate are shown in Table 3.

Ion bombardment conditions:
Cathode material: Ti
Arc current: 100 A
Type of gas introduced into subchamber: oxygen
Amount of gas introduced into subchamber: 100 sccm
Pressure in subchamber: 0.01 Pa
Applied voltage to substrate: −1,000 V
Treatment time: 5 min
Deposition conditions:
Type of gas introduced into subchamber: oxygen
Amount of gas introduced into subchamber: 150 sccm Pressure in coating chamber: 0.65 Pa
Applied voltage to substrate: −50 V
Treatment time: 20 min

TABLE 3

| | Measured Results | |
|---|---|---|
| | With subchamber (present invention) | Without subchamber (comparative example) |
| Average surface roughness (Ra) | 0.04 μm | 0.6 μm |
| Bonding strength | 20 N | 5 N |

Embodiment 5

Figure 4:
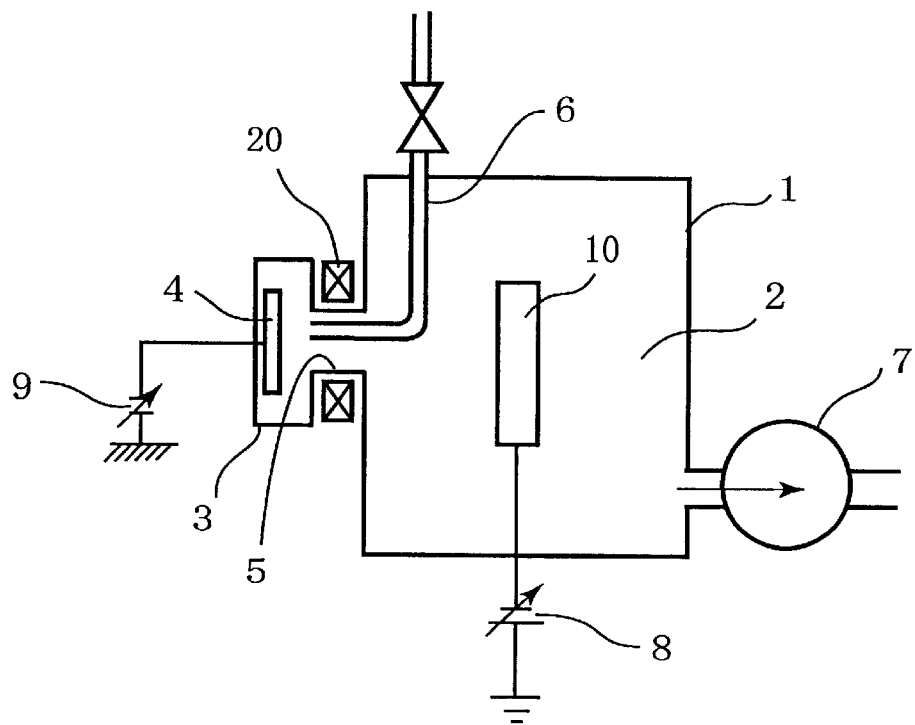
FIG. 4 is a diagram showing the outline of an embodiment in which the connecting portion between the coating chamber and the subchamber is reduced in cross section and a magnetic field-forming coil is provided at this portion.

The coating machine shown in FIG. 4 was used to form a coating layer of TiN, 2 μm in thickness, on the surface of a cemented carbide drill having a diameter of 10 mm. In FIG. 4, a magnetic field-forming coil 20 controls the movement of ions. The ion bombardment conditions were the same as those in Embodiment 1. The coating layer of TiN was formed under the same conditions as those in Embodiment 1.

The cemented carbide drill had an average surface roughness of 0.005 μm before the ion bombardment. The average surface roughness was increased to 0.02 μm after the ion bombardment. After the coating layer was formed, the average surface roughness became 0.03 μm. This result shows that even when the surface roughness has a small magnitude after the ion bombardment, the surface roughness deteriorates by scattering molten particles during the deposition process as well.

This drill was subjected to a dry cutting test using a work material made of S50C steel. The result was satisfactory in discharging the chips and in drilling holes of good quality to the depth of 50 mm. Because of the reduced thrust, the drill had a long life so as to enable drilling a total of about 400 holes.

A drill having a conventional coating layer with an average surface roughness, Ra, of 0.2 μm was subjected to the same test as well. The result, however, was unsatisfactory, because clogging by the chips prevented any holes from being drilled.

Another test for drilling 30-mm-depth holes was carried out. The drill of the present invention made as many as about 700 holes. On the other hand, a conventional drill having an average surface roughness of 0.2 μm drilled no more than 300 holes.

In Embodiments 1 to 5 above, TiN, ZrC, and TiO layers were formed. However, the coating layers to be formed by the process of the present invention are not limited to those layers.

INDUSTRIAL APPLICABILITY

As is stated above, the present invention provides a subchamber that is less evacuatable than the coating chamber to place an arc evaporation source there. At least at the time of substrate cleaning, a gas such as nitrogen is introduced from the gas-introducing portion provided at the subchamber in order to maintain a higher gas pressure in the subchamber than in the vicinity of the substrate. This enables suppression of the generation of molten particles without reducing the sputtering effect on the substrate. The present invention, therefore, enables the formation of a coating layer that has both excellent bonding strength and surface roughness, contributing to the improvement of the performance of revolving cutting tools and other products.

What is claimed is:

1. A vacuum arc coating process provided with an arc evaporation source and a substrate which are placed in a vacuum chamber to produce discharges at a surface of a cathode of the arc evaporation source so that the generated ions clean the substrate and subsequently form a coating layer on the substrate, the process comprising:
   (a) providing the vacuum chamber with a subchamber having a gas-introducing portion;
   (b) providing the vacuum chamber with a coating chamber,
   (c) connecting the subchamber to the coating chamber through a passage having an opening with a reduced cross-sectional area to cause flow resistance between the subchamber and coating chamber;
   (d) placing the arc evaporation source in the subchamber; and
   (e) introducing at least one type of gas selected from the group consisting of a reactive gas and an inert gas into the subchamber from the gas-introducing portion at the time of substrate cleaning, whereby a higher gas pressure is maintained in subchamber than in the vicinity of the substrate due to the passage having a reduced cross-sectional area.

2. The vacuum arc coating process as defined in claim 1, wherein the gas pressure in the subchamber is controlled to fall within the range of 0.0001 to 10 Pa.

3. A vacuum arc coating process as defined in claim 1, wherein at least one type of gas selected from the group consisting of nitrogen, hydrogen, methane, argon, helium, acetylene, and oxygen gases is used as a gas to be introduced into the subchamber.

4. The process according to claim 1, comprising varying the flow resistance between the subchamber and coating chamber.

5. The process according to claim 4, comprising varying the flow resistance using a flap to adjust the opening of the passage.

6. The process according the claim 4, comprising varying the flow resistance using a shutter to adjust the opening of the passage.

7. A vacuum arc coating machine comprising:
   a vacuum chamber comprising a subchamber and a coating chamber,
   the subchamber having a gas-introducing portion and connected to the coating chamber through a passage having an opening with a reduced cross-sectional area to cause flow resistance between the subchamber and coating chamber; and
   an arc evaporation source in the subchamber, wherein the passage having a reduced cross sectional area maintains a higher gas pressure in the subchamber than in the coating chamber.

8. The vacuum arc coating maching according to claim 7, comprising means for varying the flow resistance between the subchamber and coating chamber.

9. The vacuum arc coating maching according to claim 8, wherein the means for varying the flow resistance comprises a flap to adjust the opening of the passage.

10. The vacuum arc coating maching according to claim 8, wherein the means for varying the flow resistance comprises a shutter to adjust the opening of the passage.

* * * * *